US006586945B1

(12) United States Patent
Geurts

(10) Patent No.: US 6,586,945 B1
(45) Date of Patent: Jul. 1, 2003

(54) METHOD AND APPARATUS FOR TESTING TONER CARTRIDGES

(75) Inventor: David Stanley Hendrick Geurts, Auckland (NZ)

(73) Assignee: Printer Ribbon Inkers Limited, Auckland (NZ)

( * ) Notice: Subject to any disclaimer, the term of this patent is extended or adjusted under 35 U.S.C. 154(b) by 0 days.

(21) Appl. No.: 09/743,056

(22) PCT Filed: Jul. 2, 1999

(86) PCT No.: PCT/NZ99/00106

§ 371 (c)(1), (2), (4) Date: Feb. 26, 2001

(87) PCT Pub. No.: WO00/02097

PCT Pub. Date: Jan. 13, 2000

(30) Foreign Application Priority Data

Jul. 2, 1998 (NZ) ............................................ 330870

(51) Int. Cl.$^{7}$ ........................ G01R 31/08; G01R 31/00
(52) U.S. Cl. ....................................... 324/527; 324/500
(58) Field of Search ................................ 324/455, 456, 324/457, 452, 500, 527; 399/9, 31, 12, 13, 27

(56) References Cited

U.S. PATENT DOCUMENTS

| | | | | | |
|---|---|---|---|---|---|
| 3,891,316 | A | * | 6/1975 | Whited | 324/455 |
| 4,958,197 | A | * | 9/1990 | Kinashi et al. | 324/455 |
| 5,499,078 | A | * | 3/1996 | Kurokawa et al. | 361/225 |
| 5,929,640 | A | * | 7/1999 | Tse et al. | 324/452 |
| 6,393,250 | B1 | * | 5/2002 | Tsukida et al. | 399/350 |

* cited by examiner

*Primary Examiner*—Christine Oda
*Assistant Examiner*—John Teresinski
(74) *Attorney, Agent, or Firm*—Cowan, Liebowitz & Latman, P.C.; Mark Montague

(57) ABSTRACT

Apparatus (1) for testing the integrity of a toner cartridge (3), the apparatus (1) including a drive means (8,11) adapted to rotate gear (12) for rotating the drum (4) in the cartridge (3), an electrical means powered and adapted to provide electrical static charges via the electrodes (14) in the contact arm (13) to enable the cartridge (3) to imitate the normal electrical operation of the cartridge (3), and to an operator to control testing conditions of the cartridge (3) being tested. The invention further includes methods of testing the integrity the cartridge (3) using the apparatus (1).

12 Claims, 2 Drawing Sheets

METHOD AND APPARATUS FOR TESTING TONER CARTRIDGES

TECHNICAL FIELD

This invention relates to a method and apparatus for testing and analysing toner cartridges. More particularly, but not exclusively, this invention relates to an apparatus for and method of testing and analysing cartridges used for laser printers, photocopiers, facsimile machines and the like.

BACKGROUND ART

Conventional testing and checking of the operational quality of toner cartridges commonly involves the use of the proprietary machine within which the toner cartridge is used. In the case of printer and facsimile cartridges, a test page can be printed to check for any deficiencies in quality of the cartridge. In situations where a number of different cartridges are being tested, a test bench would necessarily require a large space for the test machines, and the outlay would be expensive to test the integrity of a number of different cartridges.

A disadvantage with testing toner cartridges using the proprietary machine is that some drum defects and worn areas often appear outside the printable area of a test page and therefore many toner cartridge problems will not be detected using this method of testing. Further, toner coverage, consistency and density on the photo-conductive drum, condition of the drum cleaning blade, and weak spots and areas of the photo electrostatic-charging roller (PCR) may not be fully checked and analysed using a conventional testing method.

It is an object of the present invention to provide an apparatus for testing a toner cartridge that overcomes at least some of the above mentioned problems, or which at least provides the public with a useful choice.

It is an object of the present invention to provide a method of testing a toner cartridge that overcomes at least some of the above mentioned problems, or which at least provides the public with a useful choice.

SUMMARY OF THE INVENTION

According to a broad aspect of the invention there is provided an apparatus for testing the integrity of a toner cartridge, the apparatus including a drive means adapted to rotate drum gear in a said cartridge, an electrical means powered and adapted to provide electrical charges to enable the said cartridge to imitate the normal electrical operation of the said cartridge and to allow an operator to control testing conditions of the cartridge being tested.

Preferably the drive means comprises a motor being releasably attachable to a supporting frame, and drive gear being releasably attachable to the shaft of the motor to, in use, mesh with the corresponding gear in the said cartridge to be tested the electrical means is protected within a casing, and wherein the supporting frame is releasably attachable to the casing and the said cartridge bears on the top surface of the casing as a test bed.

Desirably the electrical means includes a motor speed adjustment means and a static charge adjustment means.

Preferably the electrical means further includes static charge display means to enable an operator to control the level of static charge being applied to the said cartridge.

According to a further broad aspect of the invention there is provided a method of testing the integrity of a toner cartridge comprising the steps of:

a. positioning a said cartridge to expose the photosensitive drum and to enable a drive means to mesh with corresponding drum gear;

b. arranging the drive means to mesh with the drum gear;

c. arranging for electrical means to electrically charge the said cartridge to enable the said cartridge to imitate the normal electrical operation of the said cartridge to allow an operator to control testing conditions of the cartridge.

Preferably the method further performs a toner and toner density test comprising the further steps of:

d. running the motor at a desirable speed momentarily to rotate the drum and to cause toner to appear across the exposed area of the drum to allow examination of the toner by an operator.

Preferably the method further performs a wiper blade test comprising the further steps of:

e. running the motor at a desirable rotational speed to allow observation of the drum and to cause toner to appear across the exposed area of the drum;

f. allow the drum to rotate for a number of revolutions and observe whether the toner is being removed by the wiper blade or not.

Preferably the method further performs a drum and charge device (PCR) test comprising the further steps of:

g. running the motor at a sufficient rotational speed;

h. gradually decrease the electrical voltage charge to the charge device from a maximum setting in the cartridge for a sufficient period of time to allow an operator to look for blemishes on the drum;

i. the charge device can be considered defective if blemishes that appear on the drum become larger.

Preferably the method further comprises the step of:

j. further decreasing the electrical charge for a sufficient period of time to determine whether further blemishes on the drum and any flickering and other adverse conditions occur, and if such conditions occur the charge device may be considered defective.

Preferably the method further includes a paper test of the integrity of the cartridge comprising the further steps of:

k. running the motor to rotate the drum;

l. supplying an electrical charge and causing toner to be released on the drum;

m. supplying a static charge to a paper retainer means to cause a light grade of paper to become sufficiently charged to cling to the drum:

n. placing the paper against the drum to allow toner on the drum to transfer to the paper as the paper traces over the exposed area of the drum.

Preferably the method further tests the integrity of the thickness of the drum transfer layer or for defects in the drum further comprising the steps of:

o. running the motor to rotate the drum and supplying a medium level of electrical charge;

p. supplying an electrical static charge to a hand held probe;

q. placing the probe against an area of the drum being tested to observe any blemishes.

BRIEF DESCRIPTION OF THE DRAWINGS

A preferred embodiment of the invention will now be illustrated by way of example only with reference to the accompanying drawings in which.

DETAILED DESCRIPTION OF THE DRAWINGS

Figure 1:
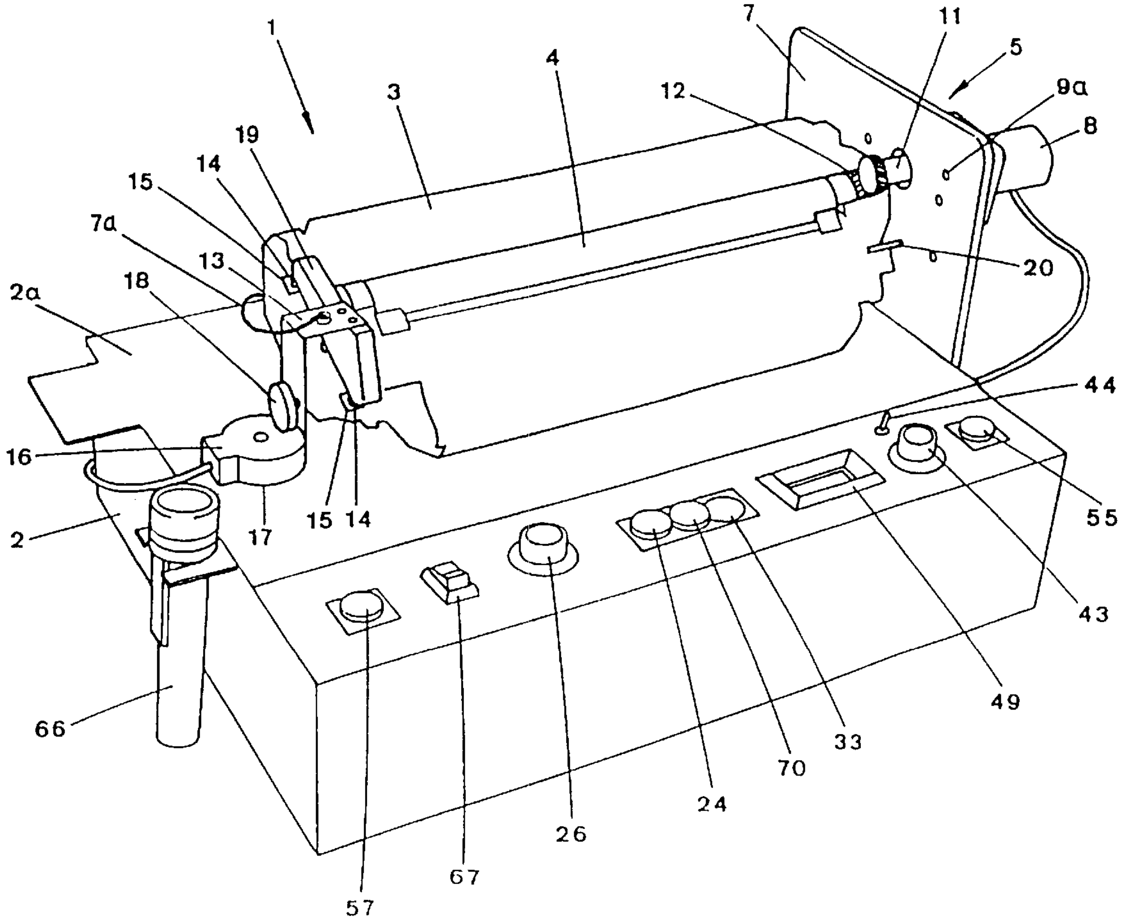
FIG. 1: illustrates a perspective view of an apparatus 1 in accordance with a preferred embodiment of the invention.
Figure 2:
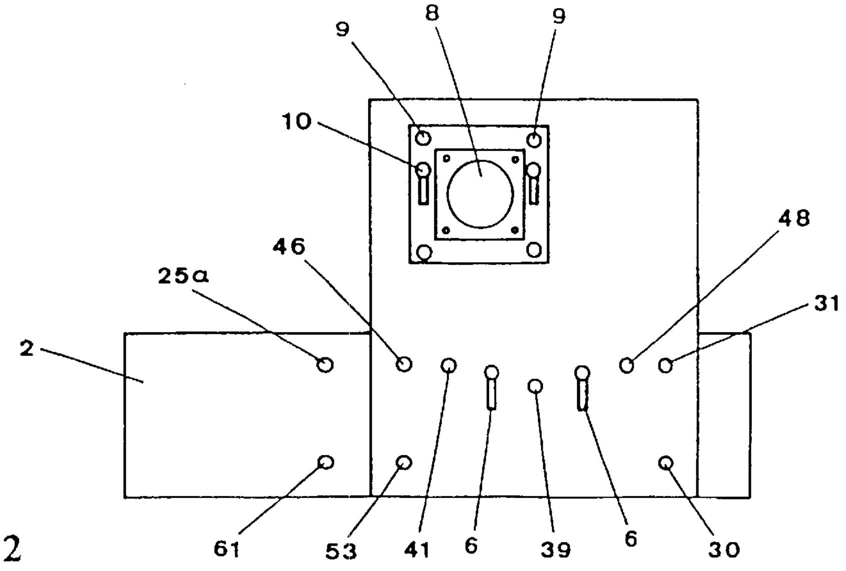
FIG. 2: illustrates an end view of the apparatus 1 of FIG. 1.

Referring to the figures, the apparatus of the invention, generally referred to as 1, according to a preferred embodiment of the invention, is illustrated.

It is considered an advantage to have an apparatus 1 that emulates or imitates the normal mechanical and electrical operation of a toner cartridge without the need to perform a cartridge test with the proprietary machine within which the toner cartridge is used. Therefore, testing of a range of different cartridges does not involve having to have a large stock of different machines present to carry out testing toner cartridges and retesting after servicing is complete.

The apparatus 1 is particularly useful for testing remanufactured toner cartridges to ensure that the integrity of the components are at an acceptable standard of quality and that the components are functioning properly. To achieve this level of testing the operation of a toner cartridge 3 on a test bed with a series of mechanical and electrical methods of testing. The result being that any defects in the cartridge 3 will be found before the remanufactured cartridge is resold.

The components of a preferred embodiment of the invention are now described.

The apparatus 1 includes a housing or casing 2 upon which the integrity of a toner cartridge 3 to be tested or analysed is desirably positioned on the top surface of the casing 2 desirably used as a test bed 2*a*. The casing 2 is desirably made of a durable and resilient material such as steel and the test bed 2*a* comprises a thicker steel such as 3 mm to enable good magnetic pull and a durable working surface. The cartridge 3 to be tested are desirably tested upside down on the test bed 2*a* to expose the optical photo conductor (OPC) or photo sensitive drum 4 and advantageously to allow easier access to other parts and components.

A cradle means, generally referred to as 5, is releasably attachable to the end of the casing 2 by fasteners in the form of cradle latches 6 to latch a supporting frame 7 to the casing 2. The cradle 5 includes a drive motor 8 being releasably attachable to the frame 7 by locating pins 9 and latches 10. Drive gear 11 is releasably attachable to the shaft of the motor 8 at one end by a push and lock fit. The other end of the drive gear 11 is meshed with corresponding helical gear 12 to enable the drum 4 of the particular cartridge 3 being tested to be rotated as required.

It will be appreciated that the drive gear 11 must correspond with the particular rotational gear of the cartridge 3 being tested and that a desirable aspect of the invention is to provide an interchangable motor and/or drive gear and/or frame 7 as required so that the apparatus 1 properly tests a wide range of differently designed toner cartridges on the same test bed.

It will be also appreciated that as different cartridges are designed to operate with proprietary printer machines then the frame 7 and drive gear 11 must be customised to position the cradle 5 and associated test condition components. In this preferred embodiment only one type of cradle arrangement for testing one particular cartridge 3 is described.

Once the drive gear 11 is meshed with the cartridge helical gear 12 a contact arm 13 can be positioned so that the spring electrodes 14 make contact with the cartridge contacts 15. The contact arm 13 is desirably anchored by a base 16 with a securing means in the form of an electromagnet 17 powered, in use, to secure the arm 13 into position. The vertical portion of the arm 13 is height adjustable and can be locked by locking screw 18. Desirably a non-conductive perspex spreader 19 retains spring electrodes 14 in an orientation so as to align or correspond with the electrical contacts located at the end of the cartridge 3.

Once the contact arm 13 is in position with respect to the cartridge 3 the electromagnet 17 is activated to secure the contact arm 13 in position. The contact arm 13 and spring electrodes 14 are supplied with power via cable 7*a*.

The frame 7 desirably is provided with a pin 20 to retain the spring-loaded drum protector in a retracted position away from the drum 5 to allow full examination and testing of the drum to occur.

Once the drive gear 11 has meshed with the corresponding cartridge gear 12 the motor 8 is activated to rotate the gear 12 to secure the cartridge 3 against the test bed 2*a*.

It will be appreciated that toner cartridges will rest against the test bed 2*a* in different positions and therefore the drive gear 11 will align with the particular helical gear 12 of the toner cartridges differently. For example, some cartridge helical gear will be located with the drive gear 11 from the rear of the casing 2 and pulled forward as in FIG. 1, some by locating from the front of the casing 2 and pushing back onto the drive gear, and some others by moving the cartridge sideways into position.

Figure 3:
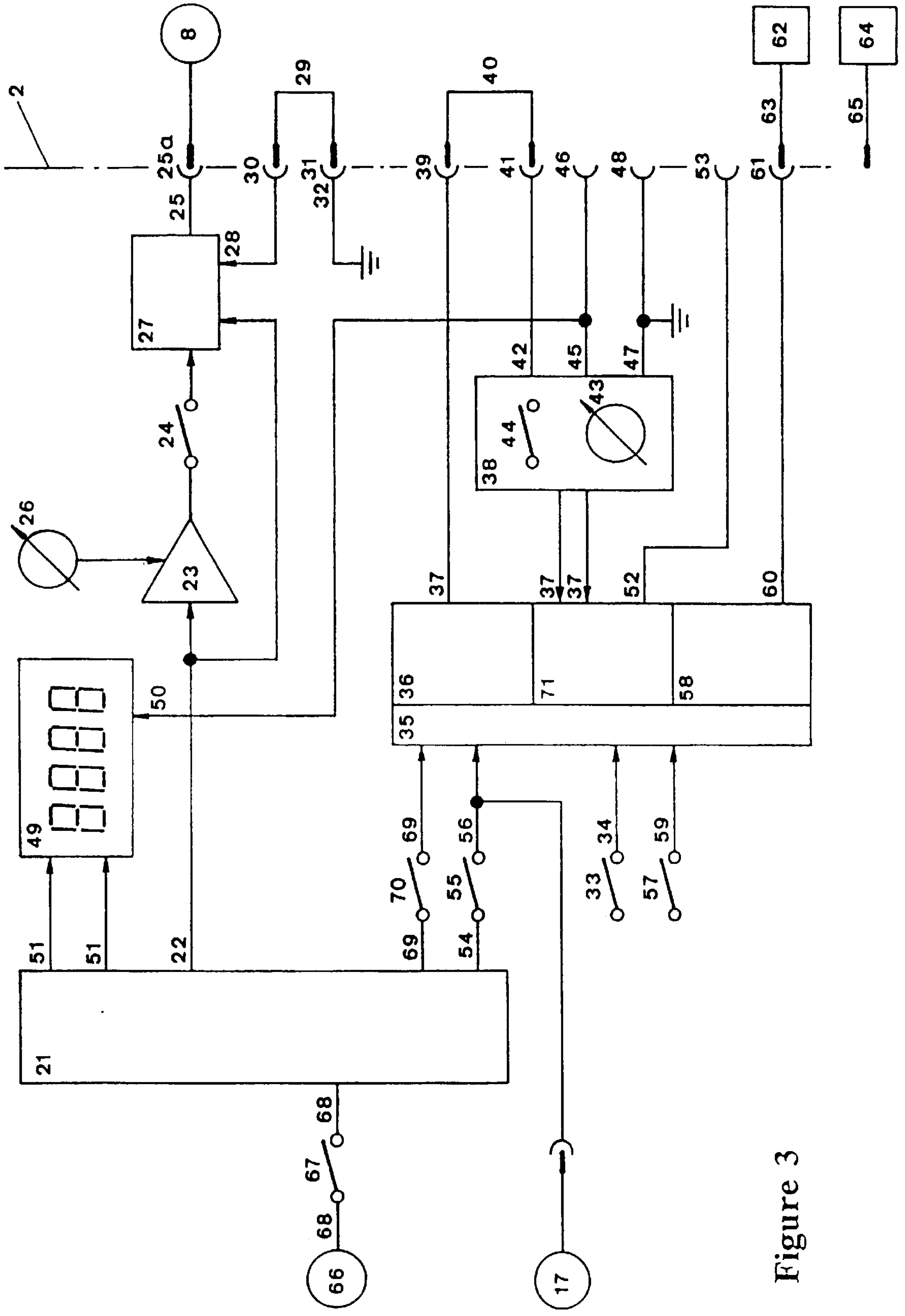
FIG. 3: illustrates a block diagram of the electrical means according to an aspect of the invention.

Referring now particularly to FIG. 3, a block diagram of the electrical means according to an aspect of the invention, is illustrated.

A power supply 21 desirably supplies direct current power to the electrical components. A 28 volt supply is fed via wire 22 to a variable speed controller 23 to control the speed of the motor 8. A switch 24 controls the operation of the motor 8 via wire 25 allowing an operator to turn the motor 8 on and off. A socket 25*a* is provided to enable the motor 8 and wire 25 to be releasably connectable as required. A motor speed adjustment means in the form of a dial or rotary switch 26 allows an operator to select the desirable speed of the motor 8 to rotate the drum 4 as required. The switch 24 has desirably about nine different speed settings with one being a slow rotational speed and nine being the fastest rotational speed.

A directional relay 27 and earthing circuit 28 is provided to reverse the direction of the motor 8 when required. This is by bridging to complete the earth circuit by link 29 between sockets 30, 31. The earthing circuit 32 and socket 31 can be used as a general earthing circuit as required.

To emulate or imitate toner cartridge operating conditions a voltage control circuit to generate a corona to liven the cartridge 3 is provided. A corona charge switch 33 is connected via wire 34 to the logic input circuit 35 and to a generator 36 to enable a voltage to be generated and fed via wires 37 to an electronic magnification module 38 via socket 39, Link 40, Socket 41 and input wire 42 for the purpose of livening the charge device (PCR), developer roller and forming a corona about the drum 4. The module 38 enables the voltage supply to be controlled by an operator during testing. Desirably this is by way of a static charge adjustment means in the form of a rotary switch 43 allowing the level of charge and magnification to be adjusted as required.

Desirably the rotary switch 43 has ten settings with one being a high charge and ten being a low charge, and that an attenuation circuit is integrated with a range switch 44 to switch between low and high ranges. It will be appreciated that the electronic magnification will be at a minimum when the electrical charge is at a maximum and vice versa.

The output 45 terminates at the socket 46 in the casing 2 to allow a corresponding plug to connect into the socket 46 to supply electrical charge the PCR in the cartridge 3 during testing. A corona charging earth circuit 47 terminates at socket 48.

The amount of electrical static charge or voltage supplied is monitored by a display means in the form of a volt meter and display 49 by way of a signal via wire 50 connected to the output of the module 38 on wire 45. The display is powered via wires 51. An operator can vary the voltage being generated by the generator 36 by adjusting the range switch 44 accordingly.

In the preferred embodiment of the invention, the charge to the PCR in the cartridge 3 can be up to about 1700 volts static charge, and the charge to the developing roller can be up to about 500 volts static charge.

Voltage is also supplied to the developing or magnetic roller in the cartridge via wire 52 to socket 53. The corona and PCR circuit includes a 24 volt supply via wire 54 through the electromagnet switch 55 and via wire 56 to the negative DC EHT generator 36. During testing a corresponding plug will connect into the socket 53 and supply a charge to the developing roller in the cartridge 3 being tested.

The output of the AC/DC EHT generator 71 is fed through wire 52 to the socket 53. The corona and PCR link 40 with corresponding plugs, during testing, is linked to the input 42 of the electronic magnification module 38 via socket 39 and 41. The link 40 is substituted for wires to cartridge contacts on a corona wire type cartridge.

When an additional drum 4 and PCR test is required an operator may conduct a paper test. In this respect an operator can close paper test switch 57 to enable the positive DC EHT generator 58 via wire 59 to supply power via wire 60 and socket 61. A hand held paper retainer 62 can be connected to the socket 61 by wire and plug 63. A static probe 64 can be plugged into the paper retainer plug 61 via wire 65 enabling an extensive test of the drum 4 by an operator placing the oppositely charged static probe 64 on the drum 4.

As an aid to visually inspecting the cartridge, and in particular toner coverage and density on the drum 4, a hand held inspection light 66 is provided. A switch 67 and circuit 68 supplies power to the light 66.

A toner circuit 69 and toner switch 70 and through generator 36 are configured to activate the magnetic roller in the cartridge 3 to cause toner to appear on the drum 4 as required.

The apparatus 1 is designed to perform a number of tests on the cartridge 3. The following methods of testing the integrity of a cartridge 3 using the apparatus 1 are now described.

The cartridge 3 to be tested is positioned on the test bed 2*a* and the frame 7 and contact arm 13 with electromagnet switch 55 closed and associated set up components are configured and arranged to be able to activate or operate the cartridge 3 to emulate normal working conditions for the components in the drum 4.

To increase the likelihood of obtaining more accurate test results ensure any direct light does not radiate onto the cartridge 3 to be tested. Desirably diffused lighting could be used.

To commence testing, the switches 57, 67, 24, 70 are open or off and the charge switch 33 is closed or on. The range switch 44 is on low. The motor adjustment rotary switch 26 can be set halfway at setting five.

To conduct a toner coverage and density test, a preliminary step is to activate the motor 8 by closing switch 24 and adjusting the speed adjustment switch 26 to obtain a desirable viewing speed for the drum 4. Once determined, the motor 8 is switched off.

With some cartridges having a non metallic developing roller the preliminary step including simultaneously switching on the motor and toner switches—24, 70 respectively.

The next step is to turn on the motor and toner switches 24, 70 respectively until toner appears across the exposed portion of the drum, at which time the switches 24, 70 are turned off. An operator can then examine the toner across the drum 4 to determine whether the magnetic roller in the cartridge 3 requires replacing. Further, the light 66 can be used to examine the density and patterns of the exposed toner.

To conduct a test on the drum cleaning wiper blade, the passive state of the apparatus 1 should include the charge switch 33, motor switch 24, and toner switch 70 being on.

To commence testing, the charge switch 33 is switched off for a moment to allow toner to be released and then switched on again. A strip of toner should appear across the drum 4. If part of the toner strip reappears after a revolution of the drum 4 then the wiper blade may not be functioning properly. Repeating the test can confirm whether the wiper blade is functioning properly or not. If it does not, the wiper blade should be replaced.

If a toner line appears transversely across the drum then turn off the toner switch 70. If the toner line disappears the drum 4 or PCR may be faulty. If the toner line remains visable the wiper blade may not be removing surplus toner off the section of the drum 4 where the toner line appears.

To conduct a drum 4 and PCR test, allow the motor 8 to continue revolving and adjust the range switch 44 to low.

Examine the printing area of the drum 4 for marks and spots. Gradually decrease the charge by turning the rotary switch 43 to a higher magnification setting. This will test the performance of the PCR and associated contacts. If spots or lines that originally appeared increase or change in size then the PCR may be at fault.

To further check the PCR adjust the range switch 44 to high and run for about 30 seconds. If inconsistent lines of varying length show on the drum 4 along with flickering then the PCR may be faulty. If spots appear on the drum 4 at a rotary switch 43 setting of below six after a number of drum 4 rotations then the PCR should be rejected.

If the marks or spots do not fade with increasing the magnification adjustment to maximum then turn off the toner switch 70. If the marks or spots are still visible there may be baked toner on the drum 4 that should be removed. Repeat the above test.

As a further defect finding step turn range switch 44 to high and increase the rotary switch 43 magnification setting to about nine to decrease the charge. If there are dark areas across the drum, it may be considered that the drum has been exposed to light. If the dark areas disappear with a high voltage setting the drum 4 is considered to be adequate. If the dark areas disappear with a magnification setting of less then four then the drum 4 may be considered defective.

With the range switch 44 on high, increase the rotary switch 43 to setting five. If any spots that were present are no longer present on the drum 4 then repeat the drum and PCR test.

If the marks or spots do not fade with the range switch 42 to high there may be a defect in the drum 4, the PCR, or the seals used in conjunction with the magnetic developer roller. A further step can include slowing down the drum 4 rotation by adjusting switch 26. If the marks or spots appear consistently as the drum rotates the fault may be with the PCR. This component can be replaced and the test then repeated.

If lines appear across the drum 4 at irregular intervals as the drum 4 rotates then the PCR may be faulty. In such a case replace the PCR and repeat the test.

If it is seen that the spots or marks on the drum 4 increase in size and repeat irregularly then it may be the drum 4 is defective. The drum 4 should then be tested.

To check the condition of the drum 4, turn the range switch 44 to high. It may be prudent to check that there is a sufficient supply of toner in the cartridge 3 by turning charge switch 33 off and then on quickly to ensure a full strip of toner appears across the length of the drum 4. The next step is to increase the setting on the range switch 43 and if dark areas or streaks of toner appear with the setting under seven then the drum 4 should be considered defective or worn.

To conduct a paper test, the motor switch 24, charge switch 33 and toner 70 must be turned on. The paper switch 57 should be switched to the on position and a hand held paper retainer 62 is provided with a static charge via wire and plug 63 into socket 61. Use a light grade paper such as typing or tracing paper and retain one end in the hand held paper retainer 62. Place the retained end of the paper against the drum 4 and allow the statically charged paper to cling to the drum 4. As the drum 4 revolves the paper will swipe the drum 4 surface giving an impression of the condition of the surface. When one complete swipe of the paper has occurred the paper can be examined for spots and blemishes.

To conduct a test on the thickness of the drum transfer layer or to check for pin sized holes in the drum 4 a static foam probe 64 can be used. The probe 64 is statically charged via wire 65 into socket 61. Switch the range switch 44 to high and set the rotary switch 43 to the zero setting. Hold the static probe 64 against any part of the exposed the drum 4. It will be seen that any pin holes and worn areas will stand out by attracting toner.

For a wire type charge device a slightly modified test would be conducted. The range switch 44 would be set to low and the setting on the rotary switch 43 to ten. If the drum 4 or areas of the drum 4 are covered with toner or vertical ripples of toner, and not thin lines, the corona wire may need to be cleaned or replaced. Once the wire has been replaced or cleaned the above test should be repeated.

A further step is to set the rotary switch 43 to zero and examine the drum 4 for any spots and marks. If a smear exists it may indicate drum 4 wear, and the state of the drum 4 should be further tested. To do so increase the motor speed by adjusting switch 26 to five on the setting. The amount of toner can be checked by quickly turning the charge switch 33 off and then on again. If a strip of toner appears across the entire length of the revolving drum 4 then enough toner is present. If not, the cartridge 3 should be removed from the test bed 2*a*, shaken, and then mounted on the test bed 2*a* again and the apparatus 1 configured to the previous step of the test.

If it is seen that there are dark areas or streaks across the drum 4 when the rotary switch 43 is set to above five, the drum 4 should be replaced. After replacement redo the test to ensure cartridge 3 is functioning adequately.

It will be appreciated that in an alternative embodiment of the invention the test bed can be an operator's test bench, and that the cradle and contact arm can be self supporting or be separated by an extendibly retractable base means connecting the cradle and contact arm. The control panel and electronic circuitry can therefore be housed in a compact casing and be placed in a convenient place on the test bench during testing.

It will be further appreciated that the apparatus 1 is designed to enable a wide variety of cartridge designs and components to be tested on the test bed 2*a*, and that the cradle frame 7 and use of various sockets are tailored to adequately test the components of the particular cartridge 3 on the test bed 2*a*.

Wherein the foregoing reference has been made to integers or components having known equivalents, then such equivalents are herein incorporated as if individually set forth. Accordingly, it will be appreciated that changes may be made to the above described embodiments of the invention without departing from the principles taught herein.

Additional advantages of the present invention will become apparent for those skilled in the art after considering the principles in particular form as discussed and illustrated. Thus, it will be understood that the invention is not limited to the particular embodiments described or illustrated, but is intended to cover all alterations or modifications which are within the scope of the appended claims.

What is claimed is:

1. An apparatus for testing the integrity of a toner cartridge, the apparatus including a drive means adapted to rotate drum gear in a said cartridge, an electrical means powered and adapted to provide electrical charges to enable the said cartridge to imitate the normal electrical operation of the said cartridge and to allow an operator to control testing conditions of the cartridge being tested.

2. An apparatus according to claim 1 wherein the drive means comprises a motor being releasably attachable to a supporting frame, and drive gear being releasably attachable to the shaft of the motor to, in use, mesh with the corresponding gear in the said cartridge to be tested.

3. An apparatus according to claim 2 wherein the electrical means is protected within a casing, and wherein the supporting frame is releasably attachable to the casing and the said cartridge bears on the top surface of the casing as a test bed.

4. An apparatus according to claim 3 wherein the electrical means includes motor a speed adjustment means and a static charge adjustment means.

5. An apparatus according to claim 4 wherein the electrical means further includes a static charge display means to enable an operator to control the level of static charge being applied to the said cartridge.

6. A method of testing the integrity of a toner cartridge comprising the steps of:

a. positioning a said cartridge to expose the photosensitive drum and to enable a drive means to mesh with corresponding drum gear;

b. arranging the drive means to mesh with the drum gear;

c. arranging for electrical means to electrically charge the said cartridge to enable the said cartridge to imitate the normal electrical operation of the said cartridge to allow an operator to control testing conditions of the cartridge.

7. A method according to claim 6 to perform a toner and toner density test comprising the further steps of:

d. running the motor at a desirable speed momentarily to rotate the drum and to cause toner to appear across the exposed area of the drum to allow examination of the toner by an operator.

8. A method according to claim 6 to perform a wiper blade test comprising the further steps of:

e. running the motor at a desirable rotational speed to allow observation of the drum and to cause toner to appear across the exposed area of the drum;

f. allow the drum to rotate for a number of revolutions and observe whether the toner is being removed by the wiper blade or not.

9. A method according to claim 6 to perform a drum and charge device (PCR) test comprising the further steps of:

g. running the motor at a sufficient rotational speed;

h. gradually decrease the electrical voltage charge to the charge device from a maximum setting in the cartridge for a sufficient period of time to allow an operator to look for blemishes on the drum;

i. the charge device can be considered defective if blemishes that appear on the drum become larger.

10. A method according to claim 9 further comprising the step of:

j. further decreasing the electrical charge for a sufficient period of time to determine whether further blemishes on the drum and any flickering and other adverse conditions occur, and if such conditions occur the charge device may be considered defective.

11. A method according to claim 6 further including a paper test of the integrity of the cartridge comprising the further steps of:

k. running the motor to rotate the drum;

l. supplying an electrical charge and causing toner to be released on the drum;

m. supplying a static charge to a paper retainer means to cause a light grade of paper to become sufficiently charged to cling to the drum:

n. placing the paper against the drum to allow toner on the drum to transfer to the paper as the paper traces over the exposed area of the drum.

12. A method according to claim 6 for testing the integrity of the thickness of the drum transfer layer or for defects in the drum further comprising the steps of:

o. running the motor to rotate the drum and supplying a medium level of electrical charge;

p. supplying an electrical static charge to a hand held probe;

q. placing the probe against an area of the drum being tested to observe and blemishes.

* * * * *